United States Patent [19]

Keep

[11] Patent Number: 4,917,761
[45] Date of Patent: Apr. 17, 1990

[54] METHOD OF RENDERING POLYMERIC MATERIALS HYDROPHILIC FOR ETCHING

[75] Inventor: Gerald T. Keep, Kingsport, Tenn.

[73] Assignee: Eastman Kodak Company, Rochester, N.Y.

[21] Appl. No.: 393,424

[22] Filed: Aug. 14, 1989

[51] Int. Cl.⁴ .................. B44C 1/22; B29C 37/00; C03C 15/00; C03C 25/06
[52] U.S. Cl. ................................ 156/668; 156/651; 156/902; 252/79.1; 252/79.2; 427/98; 427/305; 427/306; 427/307
[58] Field of Search .............. 156/651, 654, 655, 668, 156/902; 252/79.1, 79.2, 79.4; 427/98, 304, 305, 306, 307

[56] References Cited

U.S. PATENT DOCUMENTS

| | | |
|---|---|---|
| 3,758,332 | 9/1973 | Dinella et al. ............... 156/668 X |
| 4,086,128 | 4/1978 | Sugio et al. .................. 427/307 X |
| 4,457,951 | 7/1984 | D'Amico et al. ................. 427/96 |
| 4,520,067 | 5/1985 | Harris et al. .................. 428/323 |
| 4,554,182 | 11/1985 | Bupp et al. .................... 427/304 |
| 4,592,929 | 6/1986 | Tubergen et al. ................ 427/98 |
| 4,594,311 | 6/1986 | Frisch et al. .................. 430/315 |
| 4,601,783 | 7/1986 | Krulik ......................... 156/655 |
| 4,610,895 | 9/1986 | Tubergen et al. ................ 427/98 |

Primary Examiner—William A. Powell
Attorney, Agent, or Firm—John F. Stevens; William P. Heath, Jr.

[57] ABSTRACT

Disclosed is a method of rendering polymeric materials hydrophilic by treating the material sequentially with different solvents. The method is especially useful in the preparation of polymeric substrates for etching.

9 Claims, No Drawings

METHOD OF RENDERING POLYMERIC MATERIALS HYDROPHILIC FOR ETCHING

TECHNICAL FIELD

The present invention relates broadly to a method of rendering polymeric materials hydrophilic for etching. More specifically, the present invention is especially useful in situations where it is desired to render polymeric materials more hydrophilic for the improved adhesion of various coatings such as deposits of metal onto selectively conductive articles, coatings of conductive salts for reducing static, bonding of unlike polymers, etc. However, because the present invention is particularly useful in the field of selectively conductive articles, the description will be directed mainly to this application.

BACKGROUND OF THE INVENTION

Selectively conductive articles, of which circuit boards are a major example, are widely used in the electronics industry for radio, television, computers, appliances, industrial and electronic equipment. Printed circuit boards have been traditionally manufactured from a copper clad epoxy-glass laminate.

When starting with this material, the shape of the printed circuit board must first be routed out and the holes for mounting the components individually drilled. The board is then masked with photoresist, the circuitry imaged, and the copper etched away from areas where it is not wanted.

An alternative to this procedure is to injection mold the circuit board substrate with the holes in place or even with parts such as clips and bosses as integral parts of the molded article. The molded substrate is then put through several adhesion promotion steps and plated with electroless metal according to standard technology, to produce the printed circuit board. In this case, the substrate material is limited to thermoplastic resins with sufficient thermal stability and chemical properties to survive soldering. Savings may result with these injection molded circuit board substrates due to the elimination of considerable mechanical processing such as routing and drilling.

The critical parameters of a printed circuit board, from a soldering standpoint, are its heat deflection temperature, environmental stress crack resistance and thermal expansion coefficient. The higher a substrate's heat deflection temperature and environmental stress crack resistance to solder fluxes, the less likely it will blister or delaminate during soldering.

Methods for the electrochemical and electroless deposition of copper and other conductive metals onto activated substrates are well known and defined in the art and will not be detailed herein. Methods for manufacturing planar printed circuit boards from metal/resin laminates by subtractive etching of the copper are also well documented in the art.

The imaging of the circuit trace can be obtained by various methods known in the art, including use of resists before or after initial plating, or by overmolding with a noncatalytic resin as disclosed in European Patent Application Nos. 0 256 428 and 0 192 233. In these cases, it is necessary to etch the material both to promote good adhesion and to expose the catalytic particles, which are generally remote from the original molded surface of the device.

The demand for nonconductive moldable materials that will accept electroless deposits of metal is clear. In common to all of the above techniques of electroless metal deposits is the need to etch, adhesion promote, or otherwise modify the surface of such a molded part.

Many techniques for chemical etching of thermoplastics are disclosed in the literature, including U.S. Pats. 4,457,951, 4,592,929, 4,595,451, 4,601,783, 4,610,895, 4,592,852 and 4,629,636. In general, these techniques require the material to be wet or penetrated by reagents or solvents.

Alternative methods which utilize plasmas, as in U.S. Pats. 4,337,279 and 4,402,998 are more expensive and difficult to carry out, as well as exhibiting some difficulties with uniform etching and penetration into holes. For these reasons, chemical etching methods involving solvent penetration into the material are preferred.

Available materials are limited in scope by this need for chemical attack, which is usually dependent on penetration of a solvent into the material. This is best accomplished with an amorphous polymer, which typically has a low solvent resistance, as compared to a semicrystalline polymer. Thus, the most common polymers used in the art for molded circuit boards, polyethersulfone (PES) and polyetherimide (PEI), are amorphous polymers.

There are many advantages to be gained by the use of semicrystalline polymers. A property of prime importance in the field of molded circuit boards is a high Heat Deflection Temperature (HDT), since in many cases it is desirable to solder electrical components onto these devices, generally at temperatures in the range of 230 to 290° C. HDT is measured via ASTM D648, however, tests for dimensional stability of the molded parts in these temperature ranges are the standard by which sufficiently "high HDT" is judged.

For an amorphous polymer, this requires a very high glass transition temperature (Tg), which restricts the available polymers to an elite group. These polymers are typically expensive, require high processing temperatures, and have very poor flow characteristics.

Semicrystalline polymers, on the other hand, can be compounded with glass fibers or other fillers to give an HDT determined more by their Tm (melting temperature) rather than their Tg. Generally, at least about 10% glass fiber is needed. This results in much higher HTDs than would otherwise be indicated by their melt viscosities and processing temperatures of these polymers, and would allow for the use of much less expensive polymers with lower processing temperatures and good flow characteristics.

For example, poly(cyclohexylenedimethylene terephthalate) (PCT) can withstand total immersion in a 260° C. solder bath for a full minute with little ill effect. In contract, PES, which has a similar processing temperature, a higher melt viscosity, and higher cost, has a Tg about 40 degrees below 260° C.

Semicrystalline polymers clearly would be competitive in both cost and HDT, if they could be made to accept electroless metal plating with good adhesion.

Thus, there remains a need for a method for increasing the adhesion of deposits of electroless copper plating onto a molded article, particularly when the molded part comprises at least some semicrystalline polymer.

DESCRIPTION OF THE INVENTION

The present invention provides a means for treating a substrate to improve adhesion of a coating which is subsequently applied. According to the present invention, there is provided a method of rendering a polymeric material more hydrophilic before etching comprising the steps of contacting the material with a primary solvent to swell the material, and then contacting the material with a solvent which is miscible with both water and the primary solvent.

More specifically, according to the present invention, there is provided a method of selectively metallizing a polymeric substrate comprising the steps of (a) contacting a polymeric material with a primary organic solvent to thereby swell the polymeric material;

(b) contacting the polymeric material with a secondary solvent which is miscible with both water and the primary solvent;

(c) etching the substrate; and (d) subjecting the substrate to electroless metal plating to obtain said selectively metallized article The secondary solvent is better than said primary solvent in mixing with and dissolving in water, while the primary solvent is better at swelling the polymer.

In the broadest aspects, any polymeric material which can be solvent-swollen can be used in the present invention. The invention is particularly useful when the polymeric material is a semicrystalline polymer, or a blend of semicrystalline and amorphous polymers. These materials are harder to swell with a solvent, often require solvents that have limited compatibility with the aqueous etching solutions, and in general yield lower adhesion to coatings than that of amorphous material. In such cases, the present invention is particularly useful.

The words "amorphous" and "crystalline" used in this text either refer to a material's inherent ability to crystallize when referring to a material type, or alternatively its current state of crystallinity for a semicrystalline material when referring to a particular object, depending on context. Preferably, the composition of the substrate in a blend of amorphous and semicrystalline polymer to realize the advantages of both.

For the purpose of this document, the term "semicrystalline" is used to indicate a material that is capable of some substantial degree of crystallinity (i.e., materials capable of being prepared without crystallinity and which may be made to contain up to 40% crystalliinity). Thus, the term "Semicrystalline" includes materials which are capable of being prepared without crystallinity but which can be modified to contain up to 60% crystallinity. Normally, the preferred amount of crystallinity in the semicrystalline polymer is about 10-50% as measured by conventional techniques known in the art. For example, see *Journal of Applied Polymer Science*, Vol. 33, pp. 29-39 (1987) "Annealing Effects on the Crystallinity of Polyetheretherketone (PEEK) and its Carbon Fiber Composite" and *Polymer Science U.S.S. R.*, Vol. 28, No. 1 pp. 113-119 (1986) "The Determination of Crystallinity of New Polymer (Polymides and Other Polyetherarylenes." Differential scanning colorimetry techniques are also useful in determing crystallinity, as known in the art. Normally, crystalline polyesters containint 10-40% cr4ystallinity. The term '37 amorphous" thermoplastic" refers to materials which are incapable of being made to contain any crystalinity.

The words "mold" herein refer generically to any method of shaping a thermoplastic material including, but not limited to, injection and compression molding, extrusion and pultrusion, pressing, stamping, thermoforming, and rottional molding.

In one preferred embodiment, the semicrystalline polymer used is PCT due to its ready availability nd high HDT which is in excess of 260 C. Poly(ethylene terephthalate) (PET) may also be used but with a lower cost and HDT than PCT. Other semicrystalline polymers such as other polyesters (including poly(butylene terephthalate)), polypropylene, crystalline polyamides, poly(phenylene sulfide) and so forth may also be used.

The amorphous polymers which may be used include polyethersulfone, polysulfone (PS), polyetherimide, or polyarylate (PA), e.g., a copolymer of bisphenol A with either isophthalic acid, or mixtures of isophthalic and terephthalic acid.

To improve the hydrophilic character of the polymeric material, it is contacted with a primary solvent followed by contact with a secondary solvent miscible with both water and the water-immiscible solvent secondary solvent.

Useful primary solvents include, for example, ethylacetate, butylacetate, cyclohexanone, benzaldehyde, and the like.

Useful secondary solvents include acetone, alcohols having 1 to 8 carbon atoms, γ-butyrolactone, etc.

Preferred solvents are ethylacetate, butylacetate, and cyclohexanone as the primary solvents, and acetone and γ-butyralactone are the preferred secondary solvents.

The length of time for contacting the polymeric material with both the primary and secondary solvents is within the range of about 1-5 minutes.

Following contact of the polymeric material with both solvents as described above, the material is ready for further treatment. In the case of etching, the material is contacted with an aqueous solution of a strong base having a pH of about 10 or higher or a strong acid having a pH of about 3 or less; then the material is etched; and finally subjected to electroless metal plating to obtain said selectively metallized material.

In the preparation of selectively conductive articles such as circuit boards, a preferred process is as follows:

(1) Clean and dry the article, if necessary.

(2) Contact the article in the primary solvent of choice.

(3) Contact the article with the secondary solvent.

(4) Contact the article with a wetter (0.4 g/l GAFAC RE610 surfactant in water), 58-59° C., 1 minute.

(5) Pre-etch the article (20% $H_2SO_4$ by volume), 64-66° C., 1 minute.

(6) Etch the article in chrome/sulfuric acid (375 ±25 g/l $CrO_3$, 20% $H_2SO_4$ by volume, 0.5 g/l FC-98 surfactant), 66-67° C., 3 minutes.

(7) Rinse the article with water for 1 minute.

(8) Treat the article with neutralizer (10 ml/l of $H_2SO_4$, 40 ml/l of 35% $H_2O_2$), 10 minutes.

(9) Rinse the article with water for 1 minute.

(10) Dry the article.

(11) Subject the article to electroless copper plating.

The following examples are submitted for a better understanding of the invention.

The following thermoplastic formulations are compounded on a single-screw extruder and injection molded from a 310° C. melt into a 23° C. mold. No drying is done before treatment, in order to prevent crystallization of the PCT.

Blend A - 61% polyester, 26% PES, 10% glass fiber, 3% CAT-10 catalyst. Blend B - 54% polyester, 23% PES, 20% glass fiber, 3% CAT-10 catalyst. Blend C - 52.75% polyester, 24% PES, 20% glass fiber, 3% CAT-10 catalyst, 0.25% Irganox 1010 antioxidant. In these blends, polyester is poly(1,4-cyclohexylenedimethylene terephthalate) having an I.V. of about 0.6.0.8, PES=-Victrex 3600G polyethersulfone, CAT-10 is a catalytic powder from Johnson-Matthey, and glass fiber is Owens Corning 492AA 1/8" chopped glass fiber.

Several different solvents (T=67+8° C) were used for the swelling. Without caustic, 6 to 7 minutes in solvent is used while with caustic this is broken into three 2 minute periods interspersed with two 2 minute exposures to caustic. The remainder of the cycle (through chromic/sulfuric acid) is as outlined above. All the examples are done both with and without acetone dips between all aqueous/organic transfers (meaning 1 dip without caustic or 5 dips when caustic was used).

The resultant peel strengths are shown in Table 1. In all but one case, the addition of acetone dips increased the peel strength of the copper plate, and even in that case, it was within the error of the measurements. Peel strengths were measured with a Chatillon Dial Push-Pull Gauge Model DPP-5, with the pull being at 90° to the substrate.

TABLE 1

Peel Strength Comparison for Acetone Dips
Peel Strength (pounds/inch)

| Blend | Primary Solvent | Caustic | As-Is No Acetone | As-Is Acetone | Annealed No Acetone | Annealed Acetone |
|---|---|---|---|---|---|---|
| A | Ethylacetate | No | 1.06 ± .09 | 1.84 ± .08 | 2.04 ± .10 | 2.76 ± .11 |
| A | Ethylacetate | Yes | 1.8 ± .3 | 2.32 ± .11 | 2.40 ± .12 | 2.80 ± .04 |
| A | Butylacetate | No | 0.8 ± .2 | 1.25 ± .10 | 1.1 ± .2 | 1.8 ± .2 |
| A | Butylacetate | Yes | 1.37 ± .13 | 2.2 ± .2 | 1.88 ± .04 | 2.37 ± .06 |
| A | Cyclohexanone | No | 0.66 ± .08 | 0.52 ± .15 | 0.3 | 0.46 ± .09 |
| A | Cyclohexanone | Yes | 0.52 ± .11 | 0.9 ± .3 | 0.6 ± .3 | 1.2 ± .2 |
| B | Cyclohexanone | No | 0.51 ± .15 | 0.8 ± .3 | 0.30 ± .07 | 0.7 ± .3 |
| B | Cyclohexanone | Yes | 0.46 ± .06 | 0.7 ± .3 | 1.0 ± .7 | 1.3 ± .2 |
| C | Cold Cyclo.* | No | 0.20 ± .02 | 0.60 ± .04 | No Test | 0.76 ± .03 |
| C | Cold Cyclo. | Cold** | 0.37 ± .02 | 0.75 ± .07 | 0.56 ± .04 | 1.23 ± .10 |
| C | Cold Cyclo. | Yes | 0.56 ± .02 | 0.94 ± .14 | 0.81 ± .06 | 1.38 ± .04 |

*"Cold Cyclo." refers to cyclohexanone at room temperature (24 ± 1° C.). In all other cases, the solvents were at 70 ± 10° C.
**"Cold" here refers to use of room temperature caustic treatments. In all other cases, the caustic was at 65 ± 4° C.

Example 2

Similar experiments are performed to those above using Blend B with no caustic alternation but using benzaldehyde (for 1 to 3 minutes, 66+2° C) as the primary solvent and γ-butyrolacetone (γ-BL) (for 1 minute, room temperature) as the secondary solvent. Benzaldehyde has only trace solubility in water while γ-BL is fully miscible with both benzaldehyde and water.

For 1 minute benzaldehyde treatment, the γ-BL causes an increase from 1.4 to 2.6 #/in. for the as-is peel strengths and from 2.8 to 3.6 #/in. for the annealed samples. Similarly, with 3 minute exposure to benzaldehyde, the increases were from 1.7 to 2.4 #/in. as-is and from 2.9 to 3.6 for the annealed samples. All standard deviations are less than +0.3 #/in. A replication of these results on a different day gave similar results with lower precision.

The improvement is clearly not due to simple penetration of the γ-BL since benzaldehyde gives superior peel strengths to γ-BL in the absence of a secondary solvent rinse for either case. This is shown by comparing experiments using Blend C with the two solvents, alternated with caustic treatment as described above. Two trials with γ-BL as penetrant give peel strengths of 0.9 & 1.4 #/in. as-is and 1.8 & 2.1 #/in. annealed. This compares with use of benzaldehyde as penetrant which give 3.4 #/in. as-is and 4.0 #/in. annealed. All standard divisions are +0.12 or less.

As used herein, the inherent viscosity (I.V.) is measured at 25° C. using 0.50 gram polymer per 100 mL of a solvent consisting of 60% by weight phenol and 40% by weight tetrachloroethane.

The invention has been described in detail with particular reference to preferred embodiments thereof, but it will be understood that variations and modifications can be effected within the spirit and scope of the invention.

We claim:

1. The method of rendering a polymeric material hydrophilic before etching comprising the steps of contacting said material with a primary solvent to swell the material, and then contacting the material with a secondary solvent which has substantial solubility in both the primary solvent and water.

2. The method of claim 1 wherein said primary solvent is selected from the group consisting of ethylacetate, butylacetate, cyclohexanone, dichlorobenzane, dioctyl phthalate, and benzaldehyde.

3. The method of claim 1 wherein said secondary solvent is selected from the group consisting of acetone, alcohols having 1 to 8 carbon atoms and γ-butyrolactone.

4. The method of selectively metallizing a polymeric substrate comprising the steps of
   (a) contacting said polymeric substrate with a primary organic solvent for a length of time of about 1-5 minutes to swell said substrate,
   (b) contacting said substrate with a secondary solvent which is miscible with both the primary solvent and water;
   (c) etching the substrate; and
   (d) subjecting the substrate to electroless metal plating to obtain the selectively metallized substrate.

5. The method of claim 4 wherein said primary solvent is selected from the group consisting of ethylacetate, butylacetate, cyclohexanone, dichlorobenzane, dioctyl phthalate, and benzaldehyde.

6. The method of claim 4 wherein said secondary solvent is selected from the group consisting of acetone, alcohols having 1.8 carbon atoms and γ-butyrolacetone.

7. The method of claim 4 wherein said primary solvent is selected from the group consisting of ethylacetate, butylacetate, cyclohexanone, dichloro benzane, dioctyl phthalate, and benzaldehyde, and said secondary solvent is selected from the group consisting of acetone, alcohols having 1 to 8 carbon atoms, and γ-butyrolacetone.

8. The method of claim 1 wherein said primary solvent is selected from the group consisting of esters and aldehydes containing 1-25 carbon atoms.

9. The method of claim 4 wherein said primary solvent is selected from the group consisting of esters and aldehydes containing 1-25 carbon atoms.

* * * * *